(12) United States Patent
Sul et al.

(10) Patent No.: US 7,831,877 B2
(45) Date of Patent: Nov. 9, 2010

(54) CIRCUITRY TO PREVENT PEAK POWER PROBLEMS DURING SCAN SHIFT

(75) Inventors: Chinsong Sul, Mountain View, CA (US); Heon Kim, San Jose, CA (US)

(73) Assignee: Silicon Image, Inc., Sunnyvale, CA (US)

( * ) Notice: Subject to any disclaimer, the term of this patent is extended or adjusted under 35 U.S.C. 154(b) by 861 days.

(21) Appl. No.: 11/683,608

(22) Filed: Mar. 8, 2007

(65) Prior Publication Data
US 2008/0222471 A1 Sep. 11, 2008

(51) Int. Cl.
*G01R 31/28* (2006.01)
(52) U.S. Cl. .................... 714/731; 714/729
(58) Field of Classification Search ............... 714/726, 714/729, 731, 744
See application file for complete search history.

(56) References Cited

U.S. PATENT DOCUMENTS

| 5,663,966 | A * | 9/1997 | Day et al. .................... 714/731 |
| 5,717,700 | A * | 2/1998 | Crouch et al. ................ 714/726 |
| 5,831,459 | A * | 11/1998 | McDonald ................... 327/141 |
| 6,070,260 | A | 5/2000 | Buch et al. |
| 6,745,357 | B2 * | 6/2004 | Chrudimsky et al. ......... 714/726 |
| 6,861,867 | B2 | 3/2005 | West et al. .................... 326/38 |
| 6,877,123 | B2 * | 4/2005 | Johnston et al. ............. 714/731 |
| 6,954,887 | B2 * | 10/2005 | Wang et al. .................. 714/729 |
| 6,966,021 | B2 * | 11/2005 | Rajski et al. ................. 714/726 |
| 7,114,114 | B1 | 9/2006 | Burlison et al. .............. 714/744 |
| 7,139,952 | B2 | 11/2006 | Matsumoto et al. ......... 714/726 |
| 7,155,650 | B2 | 12/2006 | Whetsel ....................... 714/726 |
| 7,279,950 | B2 * | 10/2007 | Cranford et al. ............. 327/291 |
| 7,298,188 | B2 * | 11/2007 | Kawasaki .................... 327/153 |
| 7,620,857 | B2 * | 11/2009 | Kho ............................ 714/700 |
| 2001/0047498 | A1 * | 11/2001 | Whetsel ....................... 714/726 |
| 2004/0088618 | A1 | 5/2004 | Lurkins |
| 2005/0154948 | A1 * | 7/2005 | Dervisoglu et al. ......... 714/726 |
| 2006/0129900 | A1 * | 6/2006 | Clark .......................... 714/726 |

OTHER PUBLICATIONS

"An analysis of power reduction techniques in scan testing" by Saxena et al. This paper appears in: Test Conference, 2001. Proceedings. International Publication Date: 2001 On pp. 670-677 ISBN: 0-7803-7169-0 INSPEC Accession No. 7211375.*

(Continued)

*Primary Examiner*—Cynthia Britt
(74) *Attorney, Agent, or Firm*—Blakely Sokoloff Taylor & Zafman

(57) ABSTRACT

In some embodiments, a chip includes first and second scan chain segments each including registers and multiplexers to provide to the registers scan input signals during scan input periods and captured output signals during a capture periods. The chip also includes circuitry to provide first and second test clock signals to the registers of the first and second scan chain segments, respectively, wherein the second test clock signal is provided by a different signal path in the circuitry during the scan input periods than during the capture periods, and during the scan input periods the second test clock signal is skewed with respect to the first test clock signal. Other embodiments are described and claimed.

16 Claims, 7 Drawing Sheets

OTHER PUBLICATIONS

Dabholkar et al., "Techniques for Minimizing Power Dissipation in Scan and Combinational Circuits During Test Application," IEEE Trans. on Computer-Aided Design ofIntegrated Circuits and Systems, vol. 17, No. 12, pp. 1325-1333 (Dec. 1998).*

Rosinger et al., "Scan Architecture With Mutually Exclusive Scan Segment Activation for Shift- and Capture-Power Reduction," IEEE Trans. on Computer-Aided Design of Integrated Circuits and Systems, vol. 23, No. 7, pp. 1142-1153 (Jul. 2004).*

Wen et al., "Low-Capture-Power Test Generation for Scan-Based At-Speed Testing," Proc. ITC, pp. 1-10 (Nov. 2005).*

International Preliminary Report on Patentablility and Written Opinion mailed Sep. 17, 2009 for International Patent Application No. PCT/US2008/000046. Whole document.

"ISR / WO mailed May 8, 2008 for PCT/US2008/000046", (May 8, 2008), Whole Document.

EPO Communication pursuant to Article 94(3) EPC for European Patent Application No. 08705457.3 mailed Apr. 21, 2010.

* cited by examiner

CIRCUITRY TO PREVENT PEAK POWER PROBLEMS DURING SCAN SHIFT

FIELD

Embodiments of the inventions relate generally to scan techniques.

BACKGROUND

Scan design is used in design-for-test (DFT) for digital circuits. Scan design provides test access to improve testability of the a device under test (DUT) and reduces test cost. An example of scan design is depicted in prior art FIG. 1. A purpose of scan design is to provide test access to increase testability of combinational circuit. The scan design may replace normal internal registers with scan registers. The scan register adds a signal path called a scan path to the normal register so that the register can directly be accessed externally. The scan path can be active if a scan enable (SE) signal is set to, for example, a logical high signal (which can be referred to as 1). Otherwise, the normal path is selected and the scan register functions as a normal register. The scan path for scan registers is connected in serial fashion to form a shift register called scan chain. Since the time to load and unload scan chain dominates overall test time, there can be multiple scan chains in parallel to reduce test time. The scan chains can be accessed internally by on-chip test circuitry such as build-in self test (BIST) and/or by an external tester.

Referring to FIG. 1, an assembly 10 in an integrated circuit chip includes a scan chain 14 including multiplexers 20-1 . . . 20-N and registers (such as flip-flops) 22-1 . . . 22-N coupled to circuits in combination logic 18. Registers 22-1 . . . 22-N are clocked by a clock signal CLK. First, the scan path is selected (SE=1), and an input test pattern (SI) is shifted into the scan chains to initialize the scan registers. The output of registers 22-1 . . . 22-N is available to combination logic such as one or more of logic gates 30, 36, and 40. Second, the normal functional path is selected and primary input (PI) is forced. Then, the primary output (PO) is measured and compared against expected output. Certain outputs of combination logic 18 such as outputs of gates 30, 36, 40, and/or 42 may be provided as the 0 input to multiplexers 20-1 . . . 20-N which provide them to inputs of registers 22-1 . . . 22-N when SE=0. The clock (CLK) pulse is applied to capture the test response of combinational logic 18 into the registers. The scan path is then selected (SE=1) and the test response (test vector) is shifted out (scan out SO) while a next input test pattern is shifted in. The obtained test response SO is compared with expected response in order to decide whether the DUT is good or bad. This process repeats until all test patterns are exercised. Scan input periods are when SE=1 and capture periods are when SE=0.

FIG. 2 illustrates a scan chain segment 46 including multiple multiplexers and registers as shown in the scan chain of FIG. 1 and a lock-up latch 48 to receive the output of scan chain segment 46 and hold it until the clock transitions low. Lockup latches are used to tolerate clock skew up to, for example, a half of clock period.

The peak power problem during scan shift is illustrated in prior art FIG. 3 which includes registers 52-1, 52-2, and 52-3 in one chain clocked by a CLK1 signal, and registers 54-1 and 54-2 in another scan chain clocked by a CLK2 signal, each coupled to combinational logic 50. (Multiplexers are not illustrated because of limited space.) Of course, the chains may be much larger. When the scan chains are loaded, a potentially excessive number of transitions can be injected into the combinational logic from the scan registers. Those injected transitions can cause outputs of logic gates to switch and create more transitions within the DUT.

Creation of transitions requires power which is supplied from the supply voltage (VDD). Such excessive instantaneous power demand can create supply voltage noise such as is shown in FIG. 4. The resulted supply voltage noise may alter the operating frequency of the DUT and may cause timing problems such as hold-time violations. The resulted timing problems may fail the intended test function and lead to incorrect test decision.

To help with this problem, prior art assemblies such as in FIG. 3 provide the scan shift clocks in different phases (at different times), called clock skew. For example, in FIG. 5, shift clocks CLK1, CLK2, . . . CLKn have rising edges at different times. However, prior art circuits have not used clock skew effectively.

SUMMARY

In some embodiments, a chip includes first and second scan chain segments each including registers and multiplexers to provide to the registers scan input signals during scan input periods and captured output signals during capture periods. The chip also includes circuitry to provide first and second test clock signals to the registers of the first and second scan chain segments, respectively, wherein the second test clock signal is provided by a different signal path in the circuitry during the scan input periods than during the capture periods, and during the scan input periods the second test clock signal is skewed with respect to the first test clock signal.

In some embodiments, a chip includes first and second scan chain segments each including registers and multiplexers to provide to the registers scan input signals during scan input periods and captured output signals during capture periods. The chip also includes circuitry to provide first and second test clock signals to the registers of the first and second scan chain segments, respectively, wherein the second test clock signal is skewed with respect to the first test clock signal during the scan input periods, and the first and second test clock signals are aligned during the capture periods.

In some embodiments, the chip is in a testing system.

In some embodiments, a method includes producing a first test clock signal through a first test clock circuit, and delaying a signal from the first test clock circuit. The method also includes producing a second test clock signal by providing either a capture clock signal or the delayed signal from the first test clock circuit as the second test clock signal. The method further includes providing the first test clock signal to registers of a first scan chain segment, and providing the second test clock signal to registers of a second scan chain segment.

Other embodiments are described and claimed.

BRIEF DESCRIPTION OF THE DRAWINGS

Embodiments of the invention may be understood by referring to the following description and accompanying drawings that are used to illustrate embodiments of the invention. However, the invention is not limited to the details of these drawings.

DETAILED DESCRIPTION

Figure 1:
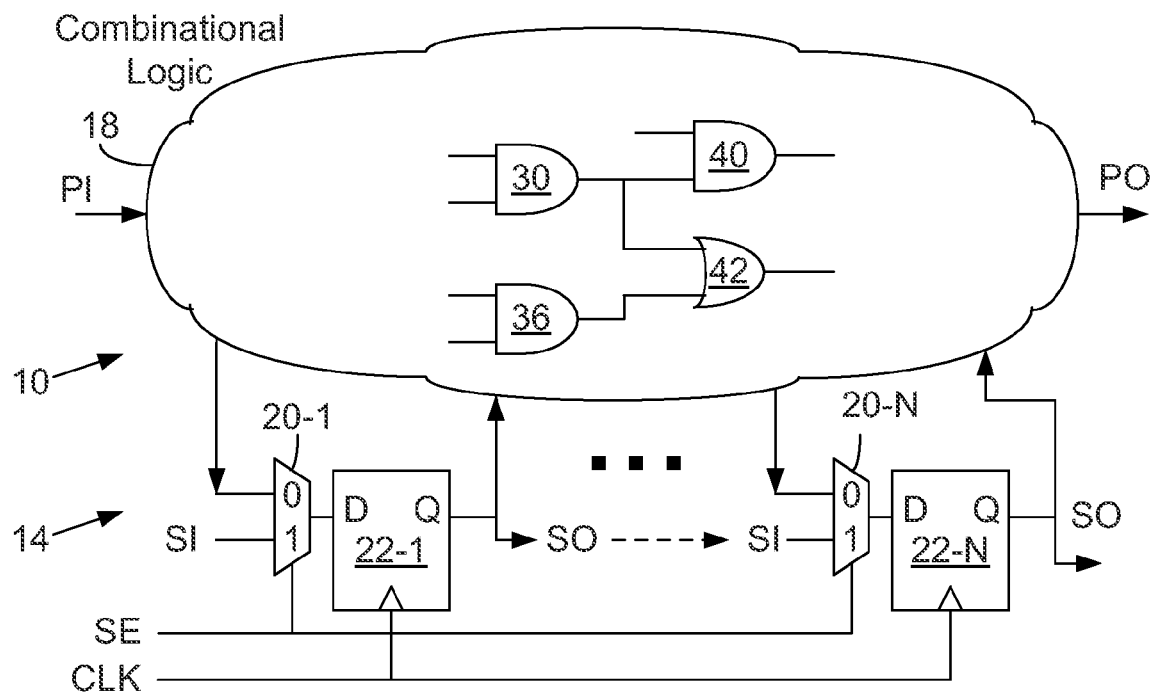
FIG. 1 is a block diagram representation of a prior art assembly including a scan chain and combinational logic.
Figure 2:
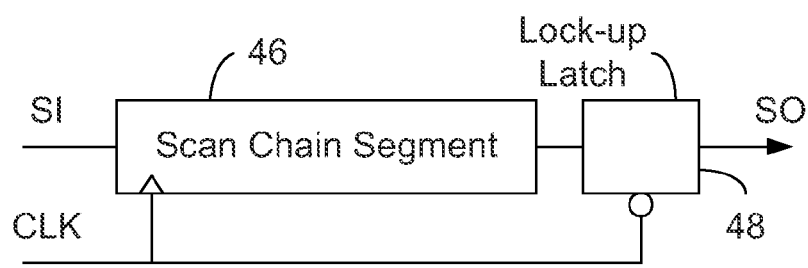
FIG. 2 is a block diagram representation of a prior art scan chain segment and a lock-up latch.
Figure 3:
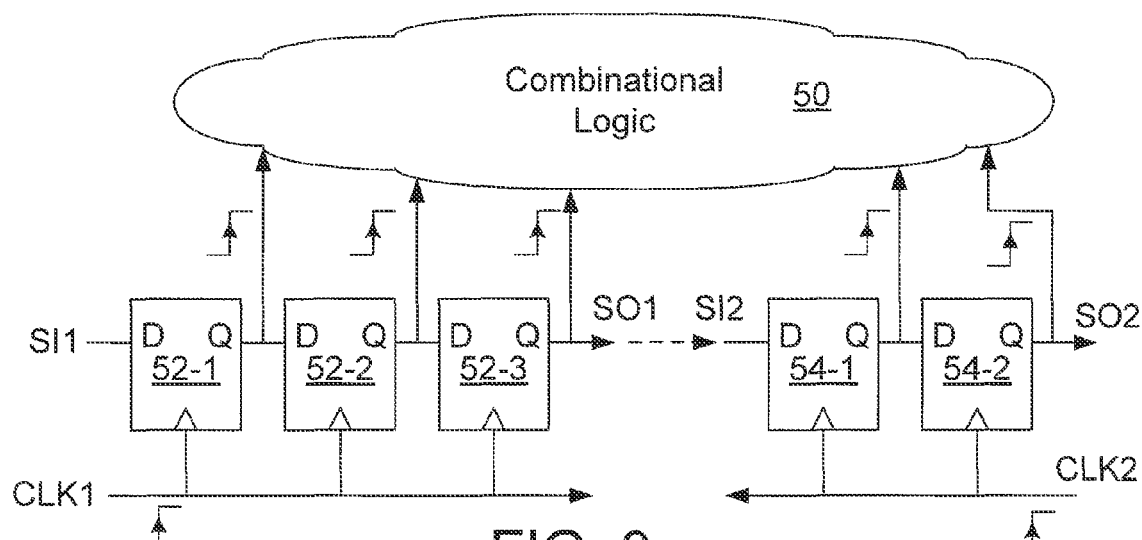
FIG. 3 is a block diagram representation of a prior art assembly including scan chains and combinational logic.
Figure 4:
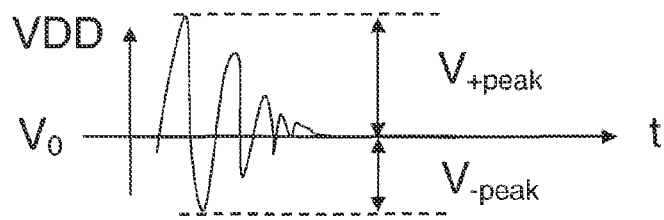
FIG. 4 is a representation of supply voltage noise related to the assembly of FIG. 3.
Figure 5:
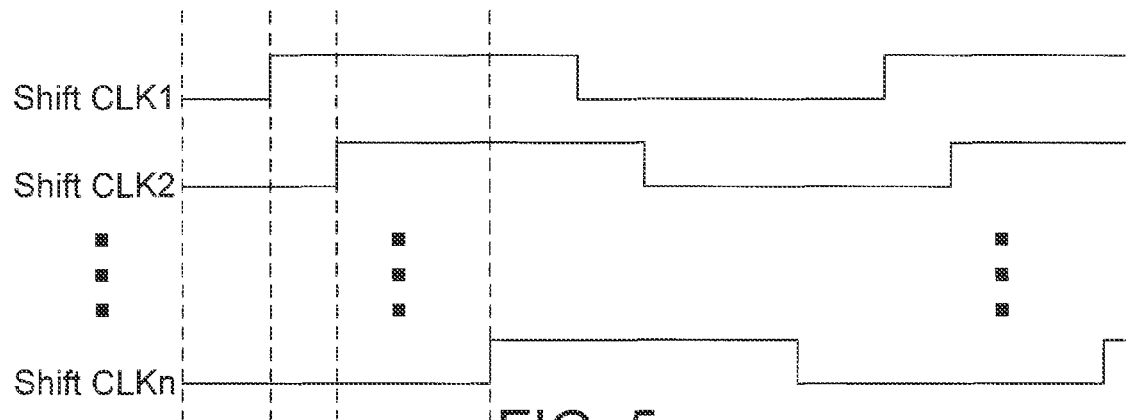
FIG. 5 illustrates a prior art scan shift schedule.
Figure 6:
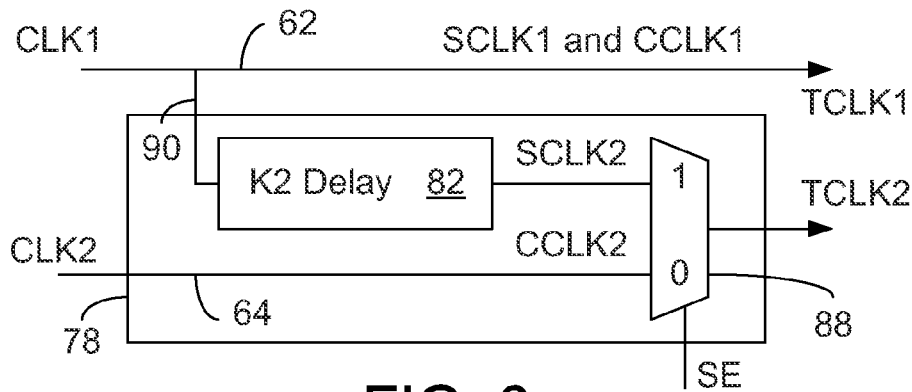
FIG. 6 is a block diagram representation of test clock circuitry to provide first and second test clock signals according to some embodiments of the invention.
Figure 13:
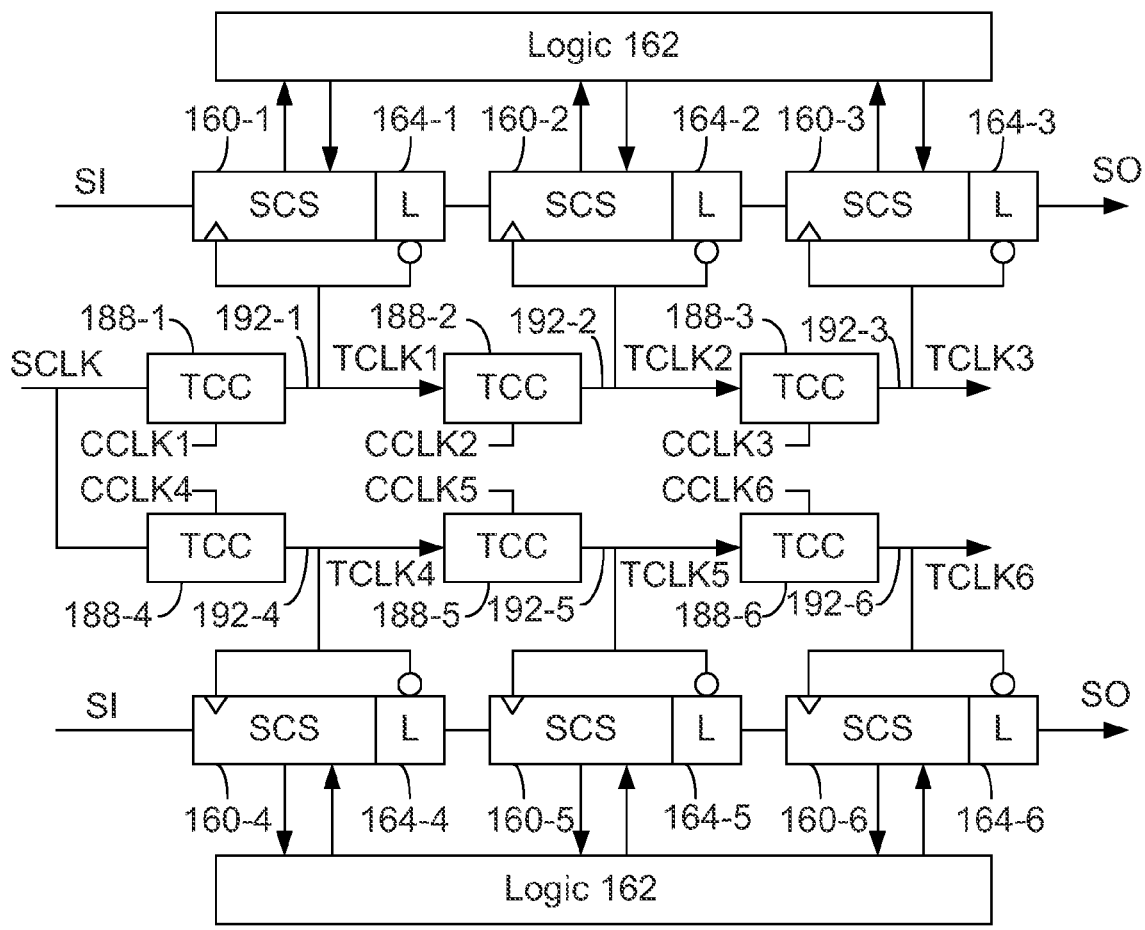
FIG. 13 is a block diagram representation of scan chain segments coupled to combinational logic and test clock circuits according to some embodiments of the invention.

Referring to FIG. 6, circuitry 60 provides first and second test clock signals TCLK1 and TCLK2 to clock registers in scan chain segments (such as are shown in FIG. 13). The TCLK1 signal is a CLK1 signal on conductor 62 that represents a scan shift clock signal during scan input periods and represents a capture clock during capture periods. The TCLK2 signal is provided by a test clock circuit 78 which includes a delay circuit 82 having a delay value of K2 (which is some amount of time such as a fraction of a clock half period). As examples, delay circuit 82 may include clock buffers, an even series of inverters, or other delay cells. Delay circuit 82 receives the TCLK1 signal on a conductor 90. A multiplexer 88 receives the output of delay circuit 82 and a clock 2 signal (CLK2) on conductor 64. When a scan enable signal is 1 (e.g., high) during the scan input periods, multiplexer 88 provides the output from delay circuit 82 as the TCLK2 signal. Accordingly, the output of delay circuit 82 is referred to as a scan shift clock (SCLK2). When a scan enable signal is 0 (e.g., low) during the capture periods, multiplexer 88 provides the CLK2 signal as the TCLK2 signal. Accordingly, the CLK2 signal is referred to as a capture clock signal (CCLK2).

Figure 8:
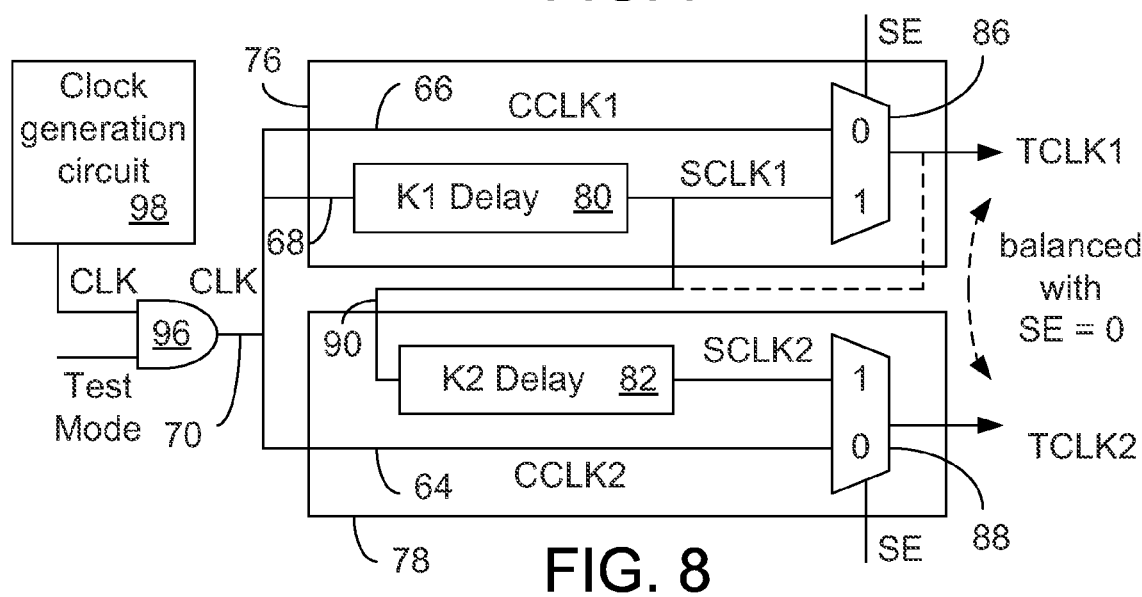
FIG. 8 is a block diagram representation of first and second test clock circuits to provide first and second test clock signals, and a clock generation circuit according to some embodiments of the invention.

Because of the delay caused by delay circuit 82, TCLK2 is skewed with respect to TCLK1 during the scan input periods, but during the capture periods when multiplexer 88 selects the CCLK2 signal, TCLK1 and TCLK2 are aligned in so far as CLK1 and CLK2 are aligned. Signals CLK1 and CLK2 may originate from a common signal because the conductors that carry are joined (such as is shown in FIG. 8) or they may be separated by circuitry. During the CLK1 and CLK2 may be aligned or not aligned depending on the implementation. Further, as can be seen in FIG. 6, TCLK2 is provided by a different signal path during the scan input periods (conductor 62 to conductor 90 to delay circuit 82 to multiplexer 88) than during the capture periods (conductor 64 to multiplexer 88).

Figure 7:
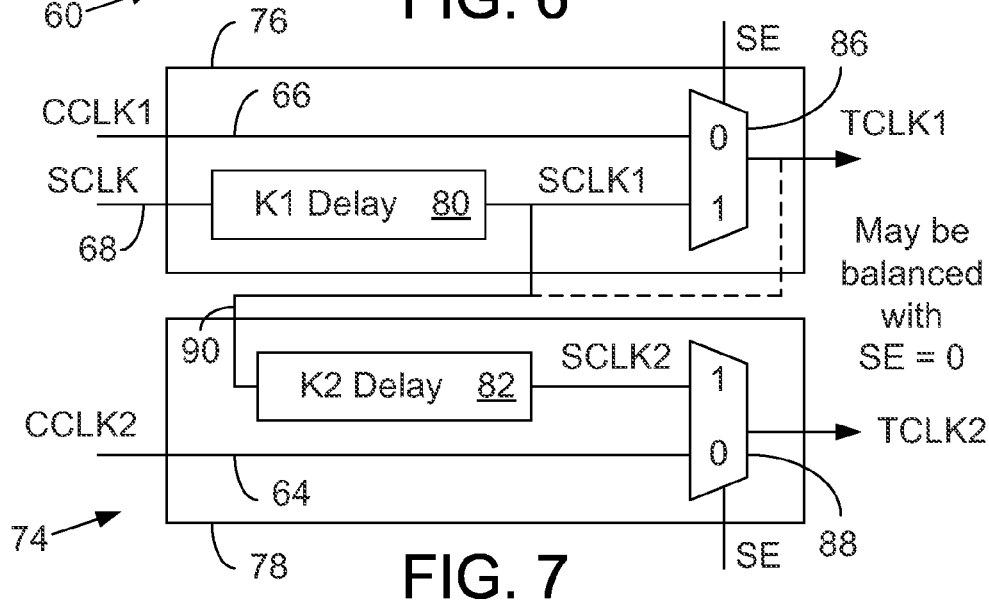
FIG. 7 is a block diagram representation of first and second test clock circuits to provide first and second test clock signals according to some embodiments of the invention.

FIG. 7 illustrates circuitry 74 to provide first and second test clock signals TCLK1 and TCLK2. The TCLK1 signal is provided by a first test clock circuit 76 which includes a delay circuit 80 having a delay value of K1 (which is some amount of time such as a fraction of a clock half period). Delay circuit 80 receives a scan shift clock signal (SCLK) on conductor 68. The output of delay circuit 80 is referred to as a first scan shift clock signal (SCLK1) to distinguish it from a second scan shift clock signal (SCLK2). A multiplexer 86 receives the output of delay circuit 80 and first capture clock signal (CCLK1) on conductor 66. A second test clock circuit 78 includes a delay circuit 82 with a delay K2 which may be the same as or different (higher or lower) than K1. Delay circuit 82 receives a signal from first test clock circuit 76 on a conductor 90. Two examples are shown in FIG. 7. As a first example, SCLK1 at the output of delay circuit 80 is provided on conductor 90 to delay circuit 82. As a second example (shown in dashed lines), the output of multiplexer 86 is provided on conductor 90 to delay circuit 82. When a scan enable signal is 1 (e.g., high) during the scan input periods, multiplexer 86 passes SCLK1 at the output from delay circuit 80 as the TCLK1 signal and multiplexer 88 passes SCLK2 at the output from delay circuit 82 as the TCLK2 signal. When a scan enable signal is 0 (e.g., low) during the capture periods, multiplexer 86 passes the CCLK1 signal as the TCLK2 signal and multiplexer 88 passes a CCLK2 signal on conductor 64 as the TCLK2 signal.

In FIG. 7, TCLK2 is skewed with respect to TCLK1 during the scan input periods, but during the capture periods TCLK1 and TCLK2 are aligned in so far as CCLK1 and CCLK2 are aligned. Further, TCLK1 and TCLK2 are provided by different signal paths during the scan input periods (conductor 68 to delay circuit 80 to multiplexer 86, and conductor 68, to delay circuit 80, to conductor 90 to delay circuit 82 to multiplexer 88) than during the capture periods (conductor 66 to multiplexer 86, and conductor 64 to multiplexer 88).

FIG. 8 is like FIG. 7 except that it shows that the CCLK1, SLK, and CCLK2 signals originate from a common signal CLK on conductor 70 that is the output of an AND gate 96. The inputs to the AND gate 96 are a test mode signal and a CLK signal from a clock generation circuit 98 (which may be a phase locked loop (PLL), delay locked loop (DLL) or other circuit). There are various other ways to implement embodiments of the invention. For example, some embodiments do not include AND gate 96 and a test mode signal.

FIG. 7 indicates TCLK1 may be balanced with SE=0 (capture periods) because CCLK1 may be aligned with CCLK2. In FIG. 8, CCLK1 is aligned with CCLK2 so they are balanced.

Figure 9:
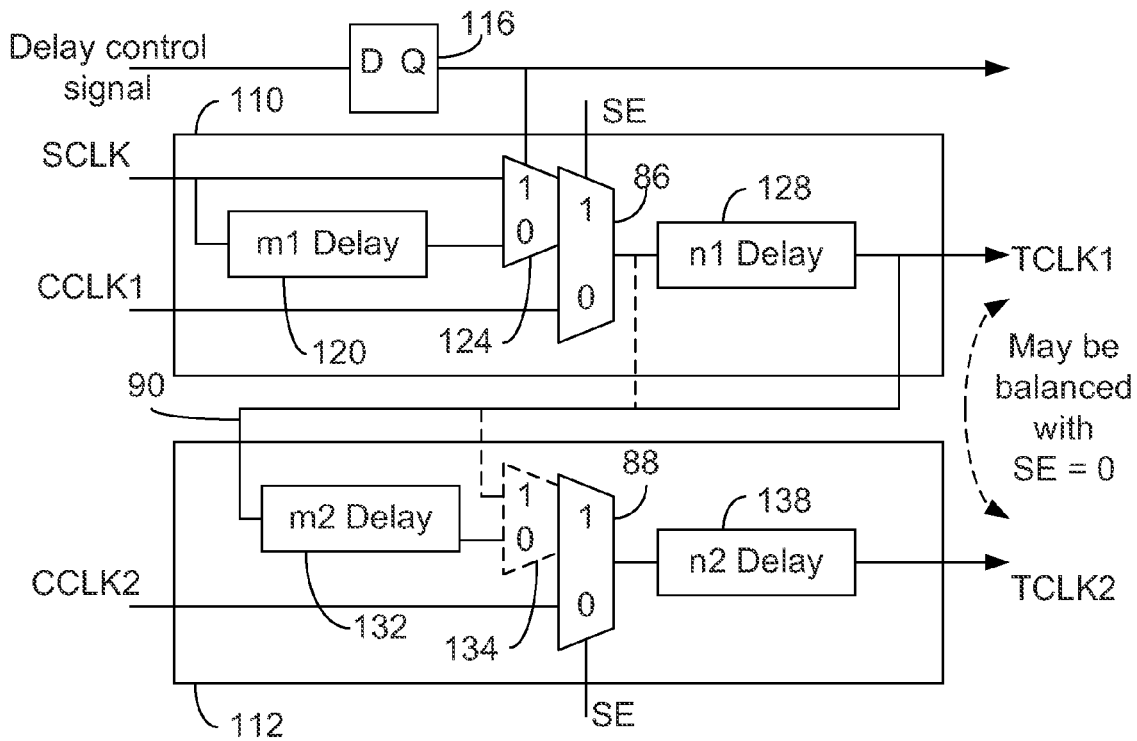
FIG. 9 is a block diagram representation of first and second test clock circuits to provide first and second test clock signals, and a control signal latch according to some embodiments of the invention.
Figure 11:
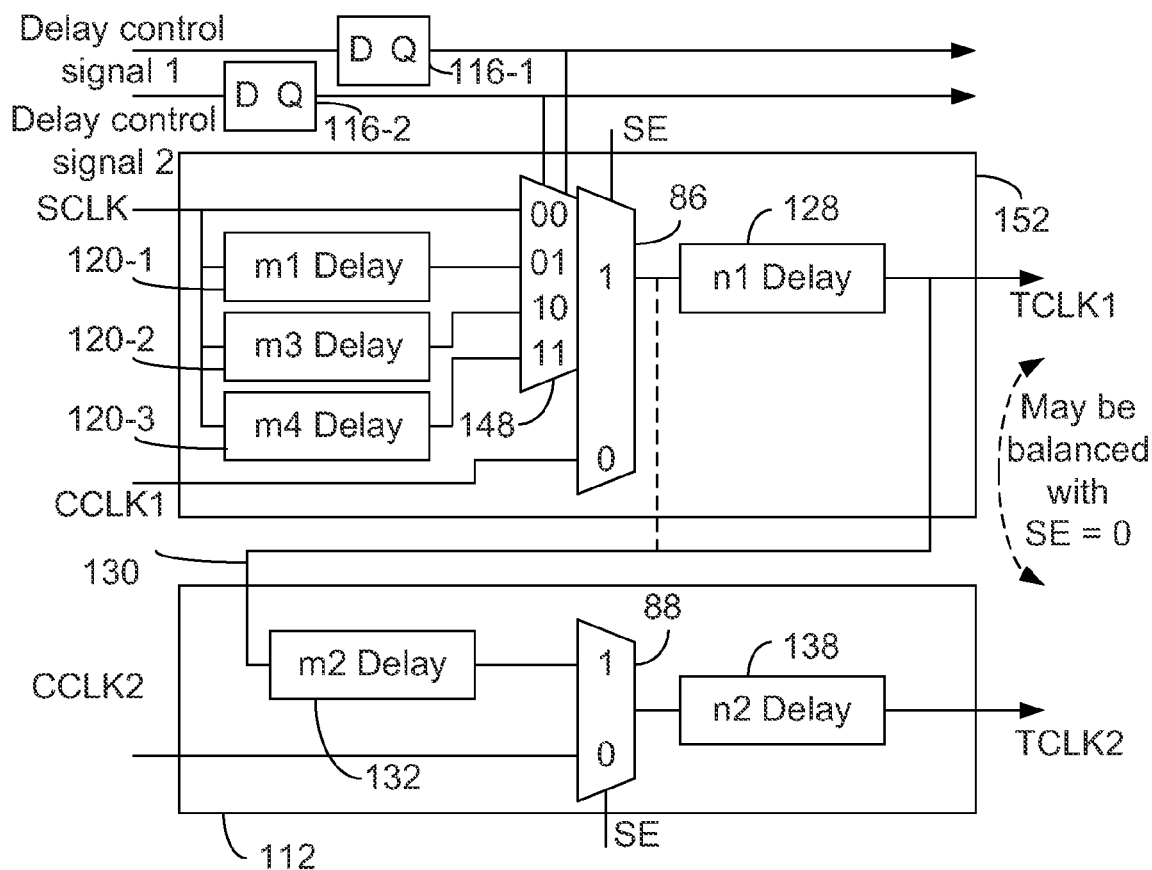
FIG. 11 is a block diagram representation of first and second test clock circuits to provide first and second test clock signals, and control signal latches according to some embodiments of the invention.

FIGS. 9 and 11 show examples of test clock circuits with a programmable delay. The programming can be carried out serially from serial_in to serial_out. Depending on the content of register 116 (or 116-1, 116-2), the SCLK or delayed SCLK can be passed as TCLK when SE=1. By including or bypassing the delay in TCLK1, the delay (or amount of clock skew) in TCLK2 can also be controlled. If similar programmability is implemented in each test clock, the overall proposed test clock structure can be very flexible to implement various schedules for scan shifts.

Referring to FIG. 9, a test clock circuit 110 includes delay circuit 120 (having a delay value m1) and a multiplexer 124 each of which receive a scan shift clock signal (SCLK). Multiplexer 124 is controlled by a value from a delay control signal through a register (latch, flip-flop) 116 to allow either SCLK or a delayed SLCK signal to an input of multiplexer 86, which also receives a first capture clock signal (CCLK1) and provides an output to delay circuit 128 (having a delay value n1). The delay control signal and multiplexer 124 allow programmable delay amounts. A test clock circuit 112 includes a delay circuit 132 (having a delay value m2) that receives a signal on conductor 90 from test clock circuit 110 from either before or after delay circuit 128 (or from some other place). A shown in dashed lines, in some embodiments, circuit 112 include a multiplexer 134 like multiplexer 124 but in other embodiments, it does not. Multiplexer 88 receives the output of delay circuit 132 or multiplexer 134 and a second capture clock signal (CCLK2). In some embodiments, multiplexer 134 can be controlled by flip-flop 116 or by another flip-flop not shown in FIG. 9. In the scan input periods (scan enable signal is 1), multiplexer 86 passes SCLK or delayed SCLK, and multiplexer 88 passes the output of delay circuit 132 or multiplexer 134, which depending on the other implementation choices is a further delayed SCLK signal or is essentially aligned with the SCLK signal from multiplexer 86. In the capture periods (scan enable signal is 0), multiplexer 86 passes CCLK1 and multiplexer 88 passes CCLK2. Delay circuit 138 (having a delay value n2) delays the output of multiplexer 134. Delay circuits 128 and 138 are not included in some embodiments.

In some embodiments, the delay values m1+n1 is the same as K1 from FIGS. 7 and 8, and m2+n2 is the same as K2, but that is not the case in other embodiments. In some embodiments, in order to reduce a number of clock buffers to implement a delay, the clock buffers in a functional or capture clock path can be utilized. In some embodiments, as a special case, if m1=m2=0, the proposed test clock circuit can be implemented using existing clock buffers (already in the design) and no additional buffers are needed, but this is not the case in other embodiments.

In FIG. 9, TCLK2 may be skewed with respect to TCLK1 during the scan input periods, but during the capture periods TCLK1 and TCLK2 are aligned in so far as CCLK1 and CCLK2 are aligned. Further, TCLK1 and TCLK2 are provided by different signal paths during the scan input periods than during the capture periods.

FIG. 11 is like FIG. 9 except that test clock circuit 152 includes delay circuits 120-1, 120-2, and 120-3 that are received by multiplexer 148 which is controlled by delay control signals 1 and 2 through registers 116-1 and 116-2. Depending on the values of control signals 1 and 2, multiplexer 148 selects SCLK or SCLK with m1, m2, or m3 levels of delay, which allows more programmability that in FIG. 9. Test clock circuit 112 may include similar circuitry.

In FIGS. 6-9 and 11, TCLK1 and TCLK2 are signals for two test clock domains. A test clock domain added by test clock circuit 78 can, for example, coincide with a functional clock domain or with a local clock domain within a hierarchy of the design. In some embodiments, a set of local scan shift clocks, SCLK1 and SCLK2 for example, can be derived from a top-level single shift clock (SCLK). In some embodiments, each local clock may be used to shift scan chain segments in each test clock domain. The desired delay can be introduced to skew each derived local clock to avoid concurrent scan shift. The inserted delays in local shift clocks can be connected in a serial fashion to form a serial chain of delays. In some embodiments, the serial chain can implement a schedule of sequential scan shifts and can guarantee non-concurrent scan shifts among certain scheduled clock domains.

Figure 10:
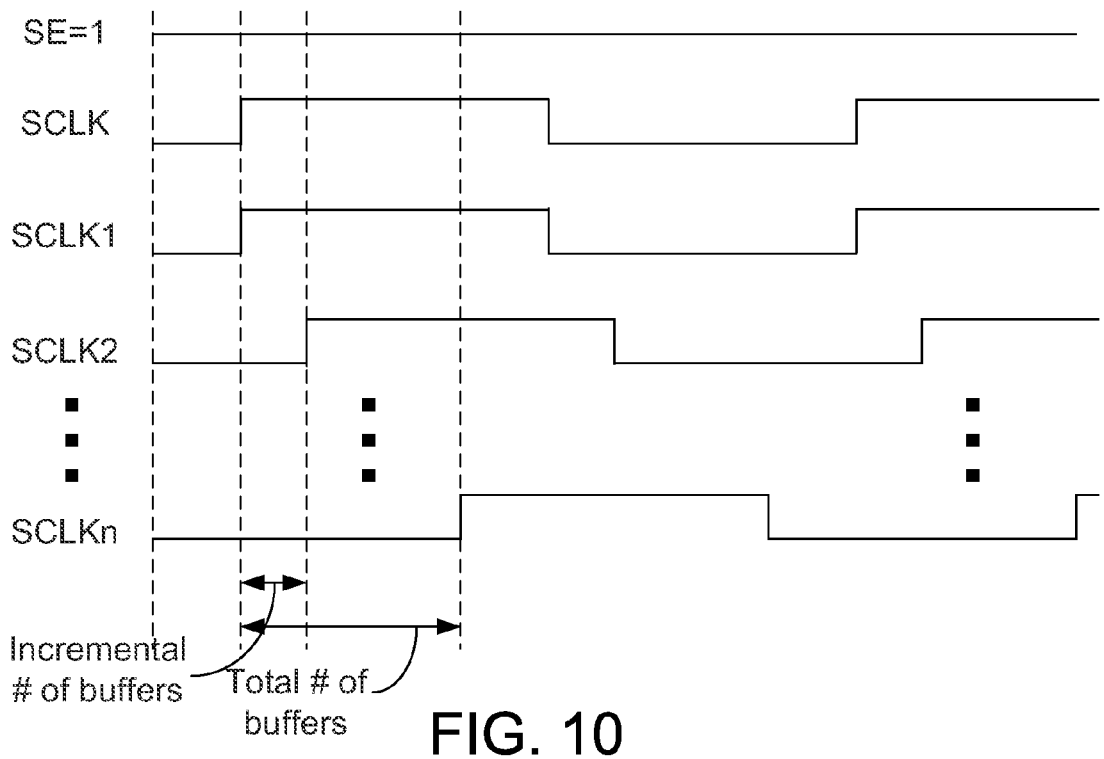
FIG. 10 illustrates scan shift schedule according to some embodiments of the invention.

FIG. 10 shows different scan shift clock signals SCLK1, SCLK2 . . . SLCKn in test clocks TCLK1, TCLK2 . . . TCLKn. The difference in phase between SCLK1 and SCLK2 may be the incremental amount of delay (for example, the incremental number of buffers). The delay between SCLK1 and SCLKn may be the total amount delay (for example, the total number of buffers). In some embodiments, the serial connection of delays in local shift clock paths may ensure that the scan shifts can be non-concurrent. In some embodiments, the delay may be determined by the settling times of transitions including small fluctuations on the supply power bus before the next scan shift can be carried out. The test time increased by introduction of delays can be negligible when compared to total test time. In FIG. 10, SCLK1 is shown as being aligned with SCLK, but it may be delayed so that SCLK1 is where SCLK2 is, and SCLK2 is further delayed, etc.

Figure 12:
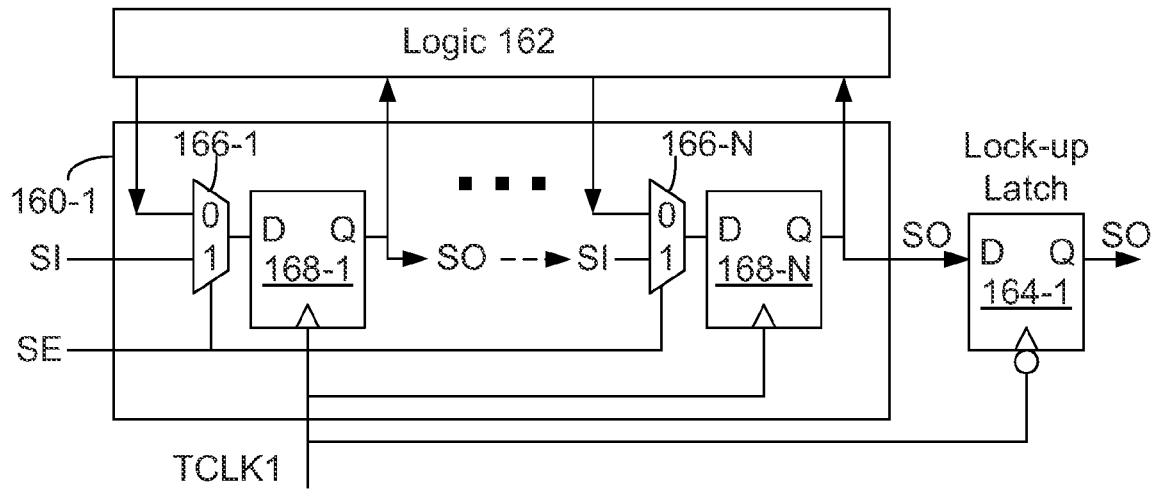
FIG. 12 is a block diagram representation of a scan chain segment and lock-up latch according to some embodiments of the invention.

Introduction of intentional delays to schedule scan shifts can cause hold-time violations when the scan data is shifted from one test clock domain to others. In order to prevent hold-time issues, lock-up latches such as lock-up latch 164-1 shown in FIG. 12 may be placed at the end of scan chain segment 160-1. Referring to FIG. 12, a scan chain segment 160-1 includes multiplexers 166-1 . . . 166-N that provide either scan input signal (SI) or captured output signals from combinational logic 162 to registers (for example, flip-flops) 168-1 . . . 168-N. A scan output signal (which may be SI or the captured signals) from register 168-N is provided to lock-up latch 164-1 which outputs it on the next falling edge of TCLK1. In some embodiments, the lockup latch may help tolerate clock skew up to a half of SCLK clock period.

There are various ways to implement the test clock circuits with scan chain segments. For example, FIG. 13 shows circuitry including test clock circuits 188-1, 188-2, 188-3, 188-4, 188-5, and 188-6 that provides test clock signals TCLK1, TCLK2, TCLK3, TCLK4, TCLK5, and TCLK6 to scan chain segments 160-1, 160-2, 160-3, 160-4, 160-5, and 160-6 (which communicate with logic 162) and lock-up latches 164-1, 164-2, 164-3, 164-4, 164-5, and 164-6. There may be additional or scan chain fewer segments. The test clock signals may be skewed as described above. The amount of delay provided may be different in different test clock circuits. In some embodiments, test clock circuits 188-1 and/or 188-4 are merely conductors like conductor 62 in FIG. 6. In some embodiments, the SO output of lock-up latch 164-3 is the SI input of scan chain segment 160-4, but in other embodiments, that is not the case. The scan chain segments can be arranged in orders other than that shown in FIG. 13. Capture clock signals CCLK1, CCLK2, CCLK3, CCLK4, CCLK5, and CCLK6 may originate from a common signal (as in FIG. 8) or two or more of them may be separated by circuitry, and they may be aligned or two or more of them may be unaligned (so they are not balanced). In some embodiments, the test clock domain can be a local clock domain within a hierarchical module, a functional clock domain, or sub-clock domain of any functional clock domain.

In some embodiments, the proposed scan structure confines timing problems during scan shift, including hold-time violations, to the test clock domain. Thus, in these embodiments, those timing problems can be resolved locally. This can be a significant advantage in hierarchical design environment where the timing problem can be resolved locally within the design hierarchy.

FIG. 13 may illustrate two concurrent sequential scan shift schedules. The scan shifts in test clock domains 1, 2, and 3 are ordered and non-concurrent, likewise with domains 4, 5, and 6. However, those two sequential scan shift schedules can be concurrent. The concurrent sequential scan shift schedules can be made sequential by imposing a sequential constraint. For example, if TCLK3 is connected to the input for TCC 188-4 (or TCLK6 to TCC 188-1), then the two concurrent sequential scan shift schedules can become a single sequential schedule.

The following outlines a timing clock circuit insertion that may be used for some embodiments. Other techniques may be used in other embodiments.

1. Create test clock domains

2. Schedule test clock domains for scan shifts

3. For each group of scan chain segments, determine required clock delay in the shift clock path (TM=1 & SE=1) and determine local domains 4. Insert determined clock delay in the shift clock path 5. Balance both functional and scan shift clocks with SE=0

6. (optional) Optimize inserted delay by utilizing clock buffers in functional or capture clock tree.

Regarding these items, the following information may be used in connection with some embodiments, but is not required for other embodiments. First, test clock domains can be created by inserting the proposed test clock circuit (TCC). An output of the TCC supplies the clock to the test clock domain. If the test clock domains are created, they can be scheduled for scan shifts. The test clock domains can be partitioned into sets of sequentially ordered test clock domains. Each set of test clock domains are ordered by inserting clock buffers in the shift clock path. The scheduled shift clocks can be connected in a serial fashion to guarantee non-concurrent scan shifts. The resulted clock tree circuitry after delay insertion can be shown in FIGS. 7-9 and 11 with only buffers inserted in the shift clock path. After the delay insertion, the functional and capture clocks can be balanced without considering shift clocks. This can be accomplished by constraining the CTS with SE=0, as mentioned earlier. The CTS places clock tree buffers to balance the functional clock tree or clock paths. Once the CTS is completed, the inserted clock buffers in the shift clock path can be replaced with the clock buffers available in the functional clock path as illustrated in FIGS. 9 and 11. Minor incremental CTS runs may be required to ensure the validity of CTS results after optimization. In some embodiments, since the shift clocks need not be balanced, they can be ignored during synthesis of capture clock trees. Since, the shift clocks can be ignored during clock tree synthesis (CTS), the proposed circuits need not complicate CTS and underlying design flow. As noted, these above details are not required for all embodiments.

Improper handling of the peak power problem can cause timing problems that can lead to incorrect test decision. It can also result in power failure in a large system chips such as system-on-chip (SOC) devices. In some embodiments, the proposed solution reduces peak power by avoiding concurrent scan shifts. In order to achieve lower peak power, in some instances, capture clocks can be separate from shift clocks. Further, a peak power reducing schedule is enforced in the shift clock paths. The schedule may have no impact on the capture clock paths. The schedule can be implemented by skewing scan shift clock using clock buffers or delay cells. Also, in some embodiments, extreme accuracy of delay is not important and any small clock buffers whose delay is large enough to avoid concurrent scan shifts may be used. However, other embodiments use special clock buffers.

Figure 14:
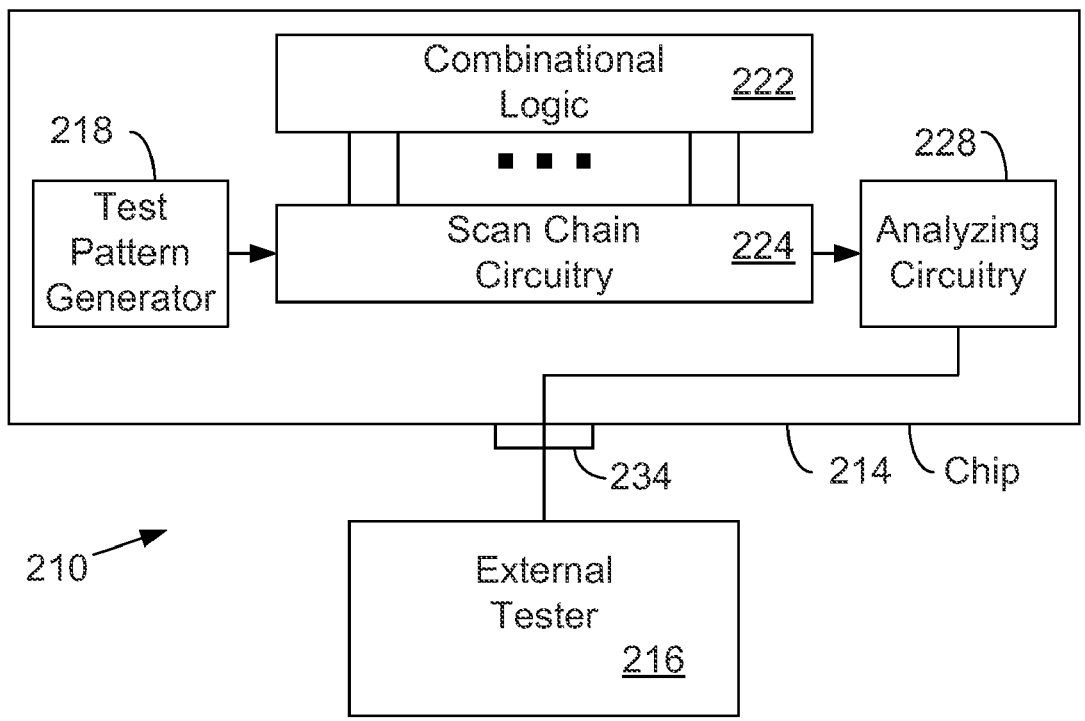
FIGS. 14 and 15 are each a block diagram representation of a chip coupled to an external tester first according to some embodiments of the invention.

FIG. 14 illustrates a system 210 with a chip 214 that includes combination logic 222 and scan chain circuitry 224 (for example, like that of FIG. 13). Scan chain circuitry 224 receives a SI signal from test pattern generator 218 and provides output signals to analyzing circuitry 228. Results of analyzing circuitry 228 may be provided through a chip interface 234 to external tester 216.

Figure 15:
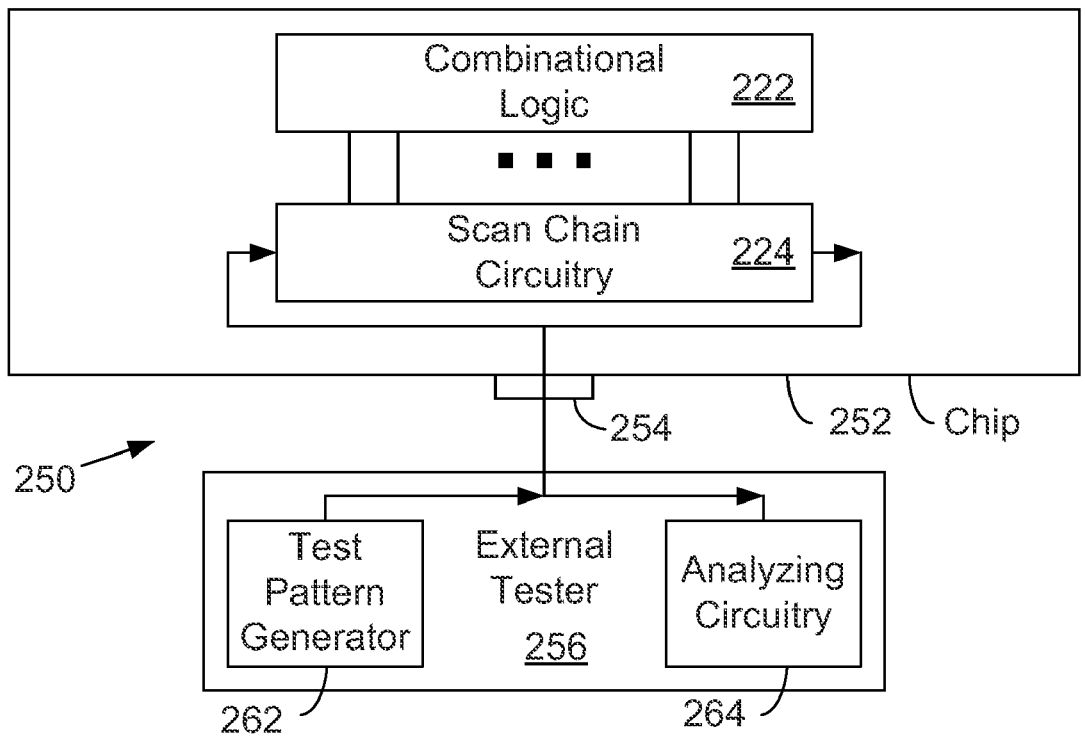

FIG. 15 illustrates a system 250 with a chip 252 that includes combination logic 222 and scan chain circuitry 224. Scan chain circuitry 224 receives a SI signal from test pattern generator 262 in external tester 256 and provides output signals through chip interface 254 to analyzing circuitry 228 in external tester 216.

The invention is not restricted to any particular signaling techniques or protocols. For example, the signaling may be single ended or differential. The signaling may include only two voltage levels or more than two voltage levels. The signaling may be single data rate, double data rate, quad data rate, or octal data, etc. The signaling may involve encoded symbols and/or packetized signals. Strobe signals could be used rather than clock signals. When a logical high voltage is mentioned, the circuitry could be modified so a logical low voltage would be used instead and vice versa.

There may be intermediate structure between the illustrated components. The various chips described or illustrated herein may have additional inputs or outputs which are not illustrated or described. In actual implementations of the systems of the figures, there would be additional circuitry, control lines, and perhaps interconnects which are not illustrated. When the figures show two blocks connected through conductors, there may be intermediate circuitry that is not illustrated. The conductors mentioned herein do not have to be of continuous material. For example, they may include vias or other connection structures. The shape and relative sizes of the blocks is not intended to relate to actual shapes and relative sizes.

An embodiment is an implementation or example of the invention. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments.

When it is said the element "A" is coupled to element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B."

If the specification states a component, feature, structure, process, or characteristic "may", "might", or "could" be included, that particular component, feature, structure, process, or characteristic is not required to be included. If the specification or claim refers to "a" or "an" element, that does not mean there is only one of the element.

The invention is not restricted to the particular details described herein. Indeed, many other variations of the foregoing description and drawings may be made within the scope of the present inventions. Accordingly, it is the following claims including any amendments thereto not the above description that define the scope of the inventions.

What is claimed is:

1. A chip comprising:
   first and second scan chain segments each including registers and multiplexers to provide to the registers scan input signals during scan input periods and captured output signals during capture periods; and circuitry to provide first and second test clock signals to the registers of the first and second scan chain segments, respectively, wherein the second test clock signal is provided by a different signal path in the circuitry during the scan input periods than during the capture periods, and during the scan input periods the second test clock signal is skewed with respect to the first test clock signal;

wherein the circuitry to provide the first and second test clock signals includes:

a first test clock circuit including a first delay circuit and a first multiplexer to pass a first delay clock signal as the first test clock signal during the scan input periods, the first delayed clock signal being a scan shift clock signal delayed by at least the first delay circuit, and pass a first capture clock signal as the first test clock signal during the capture periods; and a second test clock circuit coupled with the first test circuit including a second delay circuit and a second multiplexer to pass a second delayed signal as the second test clock signal during the scan input periods, the second delayed clock signal being the first delayed clock signal from the first test clock circuit delayed additionally by at least the second delay circuit, and pass a second capture clock signal as the second test clock during the capture periods.

2. The chip of claim 1, wherein the first and second test clock circuits include the first and second delay circuits at the outputs of the first and second multiplexers to delay the first and second test clock signals prior to their being provided to the registers of the first and second scan chain segments, respectively.

3. The chip of claim 1, wherein the scan shift clock signal and the first and second signal capture clock signals originate from a common signal.

4. The chip of claim 1, wherein:

the first test circuit further includes a third multiplexor to pass an output signal to the first multiplexor and a third delay circuit, wherein the third multiplexor is configurable to connect the third delay circuit in series with the first delay circuit to additionally delay the scan shift clock signal by the third delay circuit; and the second test circuit further includes a fourth multiplexor to pass an output signal to the second multiplexor and a fourth delay circuit, wherein the fourth multiplexor is configurable to connect the fourth delay circuit in series with the second delay circuit to additionally delay the first delayed clock signal by the fourth delay circuit.

5. The chip of claim 1, further comprising additional test clock circuits to provide additional test clock signals to additional scan chain segments including a third test clock circuit, and wherein an output of the second scan chain segment is connected to an input of the third scan chain segment.

6. A chip comprising:

first and second scan chain segments each including registers and multiplexers to provide to the registers scan input signals during scan input periods and captured output signals during capture periods; and circuitry to provide first and second test clock signals to the registers of the first and second scan chain segments, respectively, wherein the second test clock signal is skewed with respect to the first test clock signal during the scan input periods, and the first and second test clock signals are aligned during the capture periods;

wherein the circuitry to provide the first and second test clock signals includes:

a first test clock circuit including a first delay circuit and a first multiplexer to pass a first delay clock signal as the first test clock signal during the scan input periods, the first delayed clock signal being a scan shift clock signal delayed by at least the first delay circuit, and pass a first capture clock signal as the first test clock signal during the capture periods; and a second test clock circuit coupled with the first test circuit including a second delay circuit and a second multiplexer to pass a second delayed signal as the second test clock signal during the scan input periods, the second delayed clock signal being the first delayed clock signal from the first test clock circuit delayed additionally by at least the second delay circuit, and pass a second capture clock signal as the second test clock during the capture periods.

7. The chip of claim 6, wherein the first and second test clock circuits include the first and second delay circuits at the outputs of the first and second multiplexers to delay the first and second test clock signals prior to their being provided to the registers of the first and second scan chain segments, respectively.

8. The chip of claim 6, wherein:

the first test circuit further includes a third multiplexor to pass an output signal to the first multiplexor and a third delay circuit, wherein the third multiplexor is configurable to connect the third delay circuit in series with the first delay circuit to additionally delay the scan shift clock signal by the third delay circuit; and the second test circuit further includes a fourth multiplexor to pass an output signal to the second multiplexor and a fourth delay circuit, wherein the fourth multiplexor is configurable to connect the fourth delay circuit in series with the second delay circuit to additionally delay the first delayed clock signal by the fourth delay circuit.

9. A system comprising:

a chip including first and second scan chain segments each including registers and multiplexers to provide to the registers scan input signals during scan input periods and captured output signals during capture periods, and circuitry such that:

(1) the circuitry provides first and second test clock signals to the registers of the first and second scan chain segments, respectively, wherein the second test clock signal is skewed with respect to the first test clock signal during the scan input periods, and the first and second test clock signals are aligned during the capture periods, and (2) the second test clock signal is provided by a different signal path in the circuitry during the scan input periods than during the capture periods; and a tester coupled to the chip to receive signals related to the captured output signals;

wherein the circuitry includes:

a first test clock circuit including a first delay circuit and a first multiplexer to pass a first delay clock signal as the first test clock signal during the scan input periods, the first delayed clock signal being a scan shift clock signal delayed by at least the first delay circuit, and pass a first capture clock signal as the first test clock signal during the capture periods; and a second test clock circuit coupled with the first test circuit including a second delay circuit and a second multiplexer to pass a second delayed signal as the second test clock signal during the scan input periods, the second delayed clock signal being the first delayed clock signal from the first test clock circuit delayed additionally by at least the second delay circuit, and pass a second capture clock signal as the second test clock during the capture periods.

10. The system of claim 9, wherein the chip includes a test pattern generator to generate the scan chain input signals and analyzing circuitry to analyze the captured output signals.

11. The system of claim 9, wherein the tester includes a test pattern generator to generate the scan chain input signals, and analyzing circuitry to analyze the signals related to the captured output signals.

12. A method comprising:
  producing a first test clock signal through a first test clock circuit by either:
    producing a first delayed signal during scan input periods, the first delayed signal being produced by delaying a scan shift clock through at least a first delay circuit, or
    passing a capture clock signal during capture periods;
  producing a second test clock signal through a second test clock circuit by either;
    producing a second delayed signal during scan input periods, the second delayed signal being produced by delaying the first delayed signal additionally through at least a second delay circuit, or
    passing the capture clock signal during capture periods;
  providing the first test clock signal to registers of a first scan chain segment; and
  providing the second test clock signal to registers of a second scan chain segment.

13. The method of claim 12, wherein the second test clock signal is skewed with respect to the first test clock signal during scan input periods, and the first and second test clock signals are aligned during capture periods.

14. The method of claim 12, wherein the second test clock signal is provided by a different signal path in the second test clock circuit during the scan input periods than during capture periods, and during scan input periods the second test clock signal is skewed with respect to the first test clock signal.

15. The method of claim 12, wherein producing the first delayed signal further includes delaying the scan shift clock additionally through a third delay circuit.

16. The method of claim 15, wherein producing the second delayed signal further includes delaying the first delayed signal additionally through a fourth delay circuit.

* * * * *